(12) United States Patent
Chung (10) Patent No.: US 8,115,560 B2
(45) Date of Patent: Feb. 14, 2012

(54) RING-SHAPED VOLTAGE CONTROL OSCILLATOR

(75) Inventor: Shine Chung, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 74 days.

(21) Appl. No.: 12/686,686

(22) Filed: Jan. 13, 2010

(65) Prior Publication Data

US 2011/0169581 A1     Jul. 14, 2011

(51) Int. Cl.
*H03K 3/03* (2006.01)
*H03B 5/18* (2006.01)

(52) U.S. Cl. ... 331/57; 331/96; 331/107 SL; 331/177 V; 327/117

(58) Field of Classification Search .............. 331/96, 331/99, 100, 104, 107 DP, 107 SL, 45, 57, 331/117 D, 51, 47, 55, 34, 36 C, 177 R, 177 V; 327/115, 117
See application file for complete search history.

(56) References Cited

U.S. PATENT DOCUMENTS 6,556,089 B2 * 4/2003 Wood ........................... 331/57
7,307,483 B2 * 12/2007 Tzartzanis et al. .............. 331/57

OTHER PUBLICATIONS

Jang, S. L., "A Tail-Injected Divide-by-4- SiGe HBT Injection Locked Frequency Divider ", IEEE Microwave and Wireless Components Letters, Apr. 2009, 19(4):236-238.

Cho, L. C. et al., "A 1.2-V 37-38.5-GHz Eight-Phase Clock Generator in 0.13 μm CMOS Technology", IEEE Journal of Solid-State Circuits, Jun. 2007, 42(6):1261-1270.

Luo, T. N. et al., "A 44 GHz 0.18 μm CMOS Superharmonic Frequency Divider", Graduate Institute of Electronics Engineering, Dept. of Electrical Engineering, National Taiwan University, Taipei, Taiwan, ©2007, pp. 1409-1412.

Chien, J.C. et al., "A 32-GHz Rotary Traveling-Wave Voltage Controlled Oscillator in 0.18-μm CMOS", IEEE Microwave and Wireless Components Letters, Oct. 2007, 17(10):724-726.

Hsieh, H. H. et al., "A 63-GHz Voltage-Controlled Oscillator in 0.18-μm CMOS", Graduate Institute of Electronic Engineering and Department of Electrical Engineering, National Taiwan University, Taipei, Taiwan, Symposium on VLSI Circuits Digest of Technical Papers, 2007, pp. 178-179.

\* cited by examiner

*Primary Examiner* — Ryan Johnson
(74) *Attorney, Agent, or Firm* — Duane Morris LLP (57) ABSTRACT

In one embodiment, a circuit topology for use in an n-phase voltage controlled oscillator (VCO) or injection-locked frequency divider includes a transmission line ring having n transmission line delay segments connected at n junctions, where n is an integer greater than or equal to 3. Each transmission line segment provides a 1/n wavelength signal delay between adjacent junctions. The transmission line ring is coupled to a first power supply node. Each of the junctions has a respective transistor coupled thereto, each transistor having a first source/drain terminal coupled to its respective junction, a second source/drain terminal coupled to a second power supply node, and a gate terminal, wherein the gate terminal is coupled to a signal that is ½ wavelength out-of-phase with respect to a signal at the first source/drain terminal of the transistor.

19 Claims, 12 Drawing Sheets

RING-SHAPED VOLTAGE CONTROL OSCILLATOR

FIELD OF THE INVENTION

The present disclosure relates to voltage controlled oscillators (VCOs) and frequency dividers, and more specifically to multiple-phase VCOs and frequency dividers.

BACKGROUND OF THE INVENTION

A voltage-controlled oscillator or VCO is an electronic oscillator with its oscillation frequency controlled by a voltage input. The frequency of oscillation is varied by the applied DC voltage, while modulating signals may also be fed into the VCO to cause frequency or phase modulations.

A frequency divider is an electronic circuit that takes an input signal with an input frequency and generates an output signal with an output frequency equal to the input frequency divided by some integer n.

VCOs having multiple output phases form key building blocks for many wired and wireless communication systems. Frequency dividers are widely used in devices such as frequency synthesizers and as signal generators.

Figure 1:
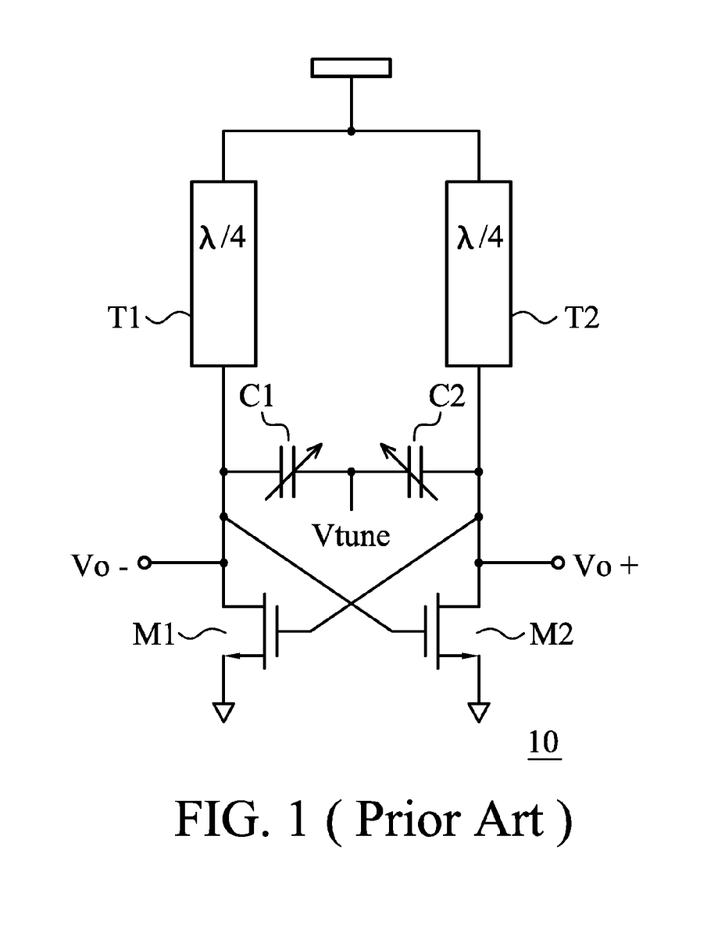
FIG. 1 is a circuit diagram of a prior art voltage controlled oscillator.

FIG. 1 is a circuit diagram of a conventional VCO 10. The VCO 10 includes a pair of NMOS transistors M1 and M2 that are cross-coupled to provide amplification. Elements T1 and T2 represent two segments of a transmission line to provide a half lambda ($\lambda/2$) delay line. The VCO 10 also includes two varactors C1 and C2 whose capacitances are tuned by the applied voltage Vtune. For low oscillation frequencies, T1 and T2 may be replaced by inductors. This circuit topology is simple and provides good performance for a high-speed oscillator. However, the VCO 10 cannot provide more than two-phased oscillations, and its circuit topology cannot be adapted to provide a VCO with an odd number of phases.

Figure 2:
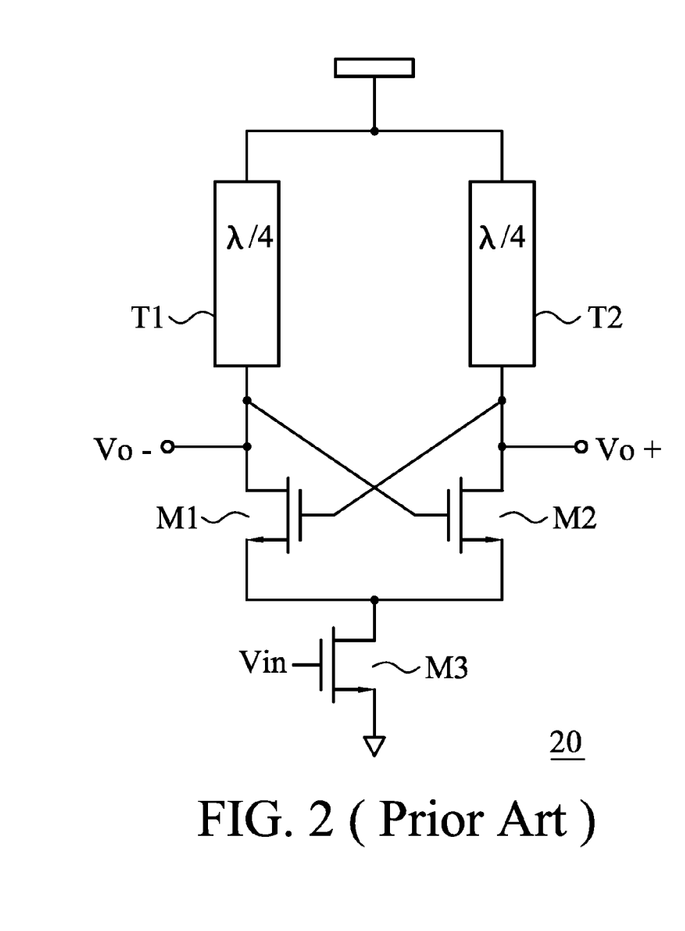
FIG. 2 is a circuit diagram of a prior art frequency divider.

FIG. 2 shows that the basic topology shown in FIG. 1 can be adapted to provide a divide-by-two frequency divider 20. With comparison to the VCO 10 of FIG. 1, the varactors C1 and C2 are removed and a common NMOS pulldown transistor M3 is disposed between the source terminals of the transistors M1 and M2 and the ground node. The input signal Vin drives the gate terminal of the pulldown transistor M3. If the transmission line setup is nearly half of the input frequency, the output Vo+ and Vo− will oscillate at half of the input frequency. This kind of frequency divider is referred to as an "injection locked frequency divider." Like VCO 10, the frequency divider 20 cannot provide more than two-phased oscillations.

While multi-phase VCOs exist in the art, these VCOs have proved difficult to design and make. The ad hoc design solutions have tight design constraints and their topologies are not easily adapted to designs having different phase numbers. In short, it has proved difficult to design a simple, high-performance VCO architecture that is generally applicable to any selected number of phases. The same difficulties can be found with the frequency dividers of the prior art.

SUMMARY OF THE INVENTION

In accordance with one or more embodiments, a circuit topology for use in an n-phase voltage controlled oscillator (VCO) or injection-locked frequency divider includes a transmission line ring having n transmission line delay segments connected at n junctions, where n is an integer greater than or equal to 3. Each transmission line segment provides a 1/n wavelength signal delay between adjacent junctions. The transmission line ring is coupled to a first power supply node. Each of the junctions has a respective transistor coupled thereto, each transistor having a first source/drain terminal coupled to its respective junction, a second source/drain terminal coupled to a second power supply node, and a gate terminal, wherein the gate terminal is coupled to a signal that is ½ wavelength out-of-phase with respect to a signal at the first source/drain terminal of the transistor.

The above and other features of the present invention will be better understood from the following detailed description of the embodiments of the invention that is provided in connection with the accompanying drawings.

BRIEF DESCRIPTION OF THE DRAWINGS

The accompanying drawings illustrate one or more embodiments of the invention, as well as other information pertinent to the disclosure, in which.

DETAILED DESCRIPTION

This description of the exemplary embodiments is intended to be read in connection with the accompanying drawings, which are to be considered part of the entire written description. In the description, terms concerning coupling and the like, such as "coupled," "connected" and "interconnected," refer to a relationship wherein components communicate with one another either directly or indirectly through intervening components, unless expressly described otherwise.

The following description provides a basic circuit topology for use in multi-phase voltage controlled oscillator (VCO) circuits and frequency divider circuits. The circuit topology can be easily adapted to provide n-phase VCO circuits and divide-by n-frequency dividers where "n" is any integer, odd or even, of 3 or greater. As will be discussed below in more detail, this basis circuit topology includes a transmission line ring that includes n number of transmission line delay segments connected in a ring at n junctions. Each transmission line segment provides a signal delay equal to 1/n wavelength (i.e., 360°/n) between adjacent junctions. A transistor is connected to each junction at its source or drain terminal (depending on whether the transistor is an NMOS or a PMOS transistor). The gate terminal is biased with a signal that is ½ wavelength delayed (i.e., 180° out of phase) with respect to a bias signal at the source/drain terminal of the transistor. This basic circuit topology can be extrapolated to accommodate any value of n (e.g.; where n is 4, 6, 8 or more). If n is an odd number, an additional delay element between gate and drain needs to be introduced to maintain $\lambda/2$ requirement. A VCO can be formed from the circuit topology by simply adding components such as varactors. An injection-locked frequency divider can be, formed from the circuit topology simply by biasing, the second source/drain terminal of the transistors under the control of an input signal that is the subject of the frequency division.

Figure 3A:
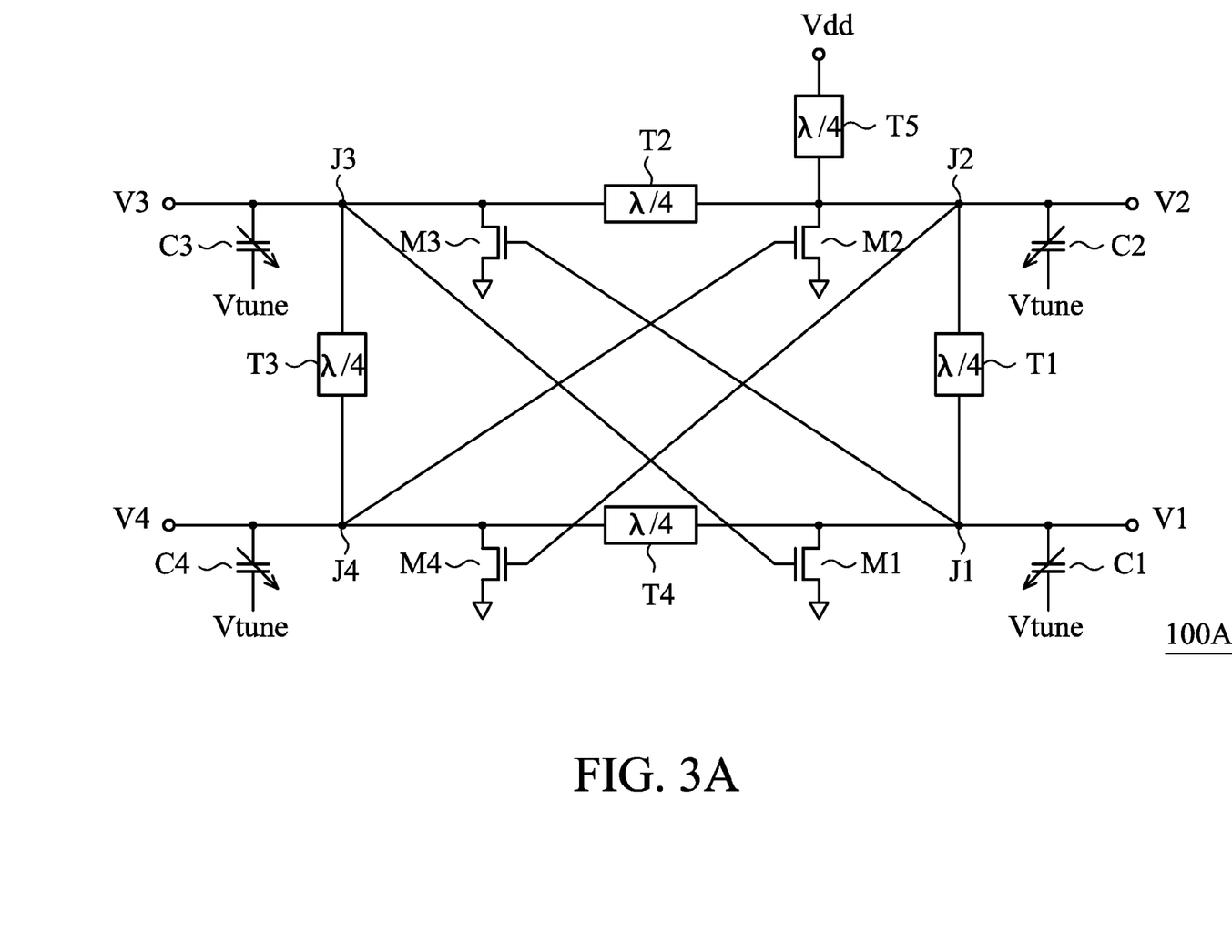
FIGS. 3A-3B are circuit diagrams of embodiments of a 4-phase VCO circuit in accordance with the present invention.
Figure 9:
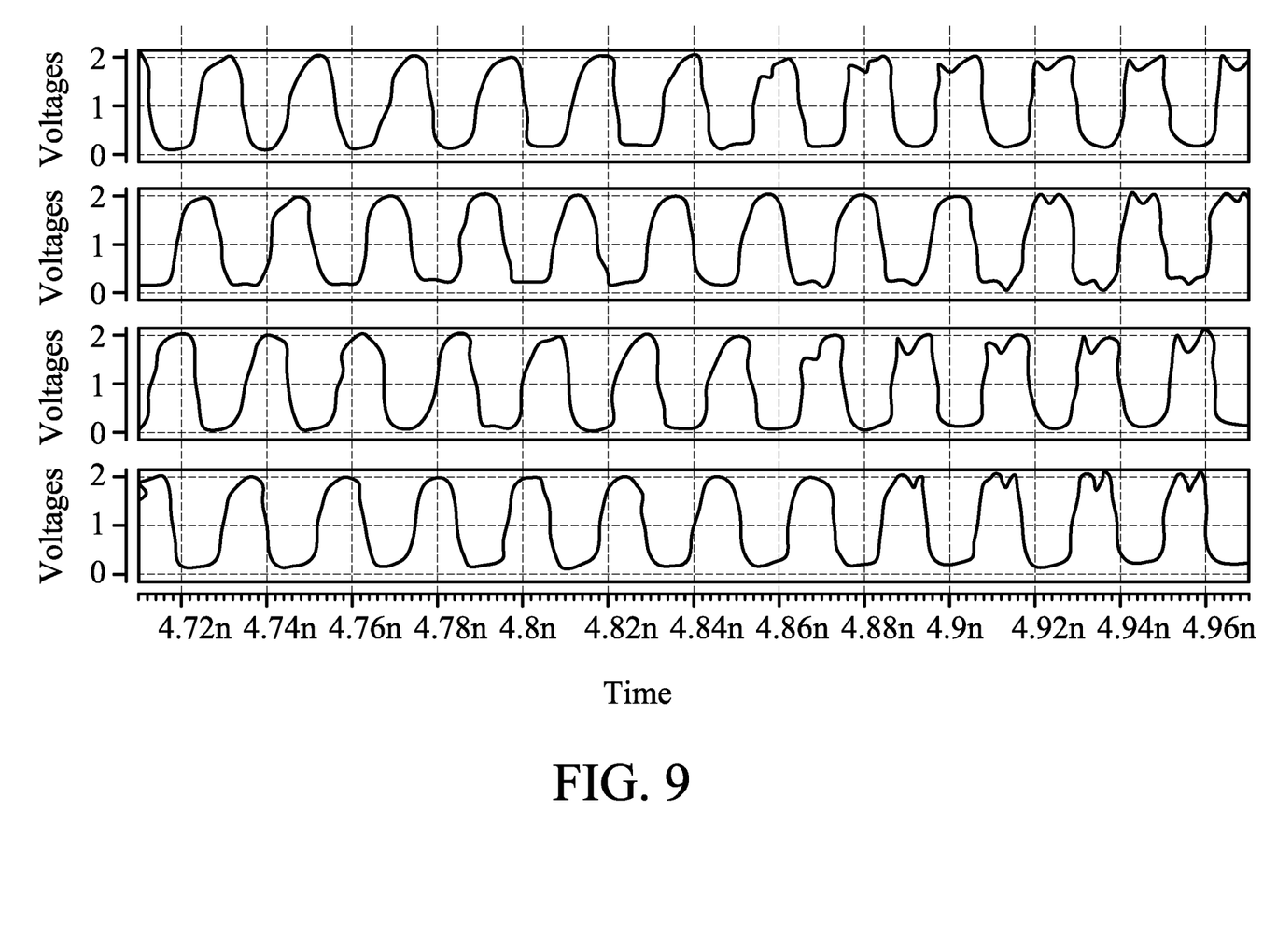
FIG. 9 shows the simulation results for a 4-phase VCO circuit.

FIG. 3A illustrates an embodiment of a 4-phase VCO circuit 100A. The VCO circuit 100A includes a transmission line ring having four transmission delay line segments T1-T4, adjacent ones of which are connected at junctions or nodes J1-J4 of the ring. Depending on the frequency of operation, a transmission delay line segment can be an inductor or a waveguide, such as coplanar waveguides, striplines or microstrips. Each delay line segment has a delay of $\lambda/n$, in this embodiment $\lambda/4$. A single transistor is shown coupled to each junction. More specifically, transistors M1 to M4 are coupled to junctions J1 to J4, respectively. Each transistor has a first source/drain terminal (drain in the illustrated NMOS embodiment) connected to the respective junction and a second source/drain terminal (source in the illustrated NMOS embodiment) connected to a low power supply node (e.g., ground). The transmission line ring is also coupled to high power supply node (e.g., Vdd) to apply a DC bias, such as by coupling one of the junctions J1 to J4 to the high power supply node Vdd through a $\lambda/4$ delay line T5. All components of FIG. 3A described thus far are generic to a circuit topology for a 4-phase VCO circuit and a divide-by-four frequency divider. Of particular note, the gate terminal of any given transistor T1-T4 is biased with a signal that is a half-wavelength ($\lambda/2$) out of phase with a signal biasing its source/drain terminal connected to its respective junction. That is, the biasing signals for the gate and drain terminals of the transistor are derived from nodes that are 180° out of phase. In the circuit 100A of FIG. 3A, this biasing can be achieved by biasing the gate of each transistor from the junction node diagonal to which its drain terminal is coupled. This 180° biasing difference drives the circuit 100A to oscillate. The frequency of the oscillation signal is controlled via the tuning voltage (Vtune), which tunes the capacitance of the varactors C1 to C4 connected to the Junctions J1 to J4. Although four varactors are shown, it should be understood that as few as one varactor may be used and coupled to each of the four junctions J1 to J4. The out of phase signals are available as outputs V1 to V4 at junctions J1 to J4. For example, the phase difference between the signal at V1 and V3 is 180°, the phase difference between signals V2 and V4 is 180° and the phase difference between V1 and V2 is 90°. As such, this 4-phase VCO circuit 100A provides 0, 90, 180, and 270 degree phases of the oscillating signal (i.e., the so-called quadrature signals). FIG. 9 shows the SPICE simulation results confirming the four phases.

As mentioned above, in the embodiment of FIG. 3A each delay line segment has a delay of $\lambda/n$, in that embodiment $\lambda/4$. By way of example only, suppose the VCO frequency ranges from 9.5 GHz to 10.5 GHz when the applied voltage changes from 2.5 V to 3.5 V to the varactor. The transmission line can be designed for the 10.0 GHz specification with proper characteristics impedance and capacitance per line. The capacitance variation from the varactor can be calculated accordingly.

Figure 3B:
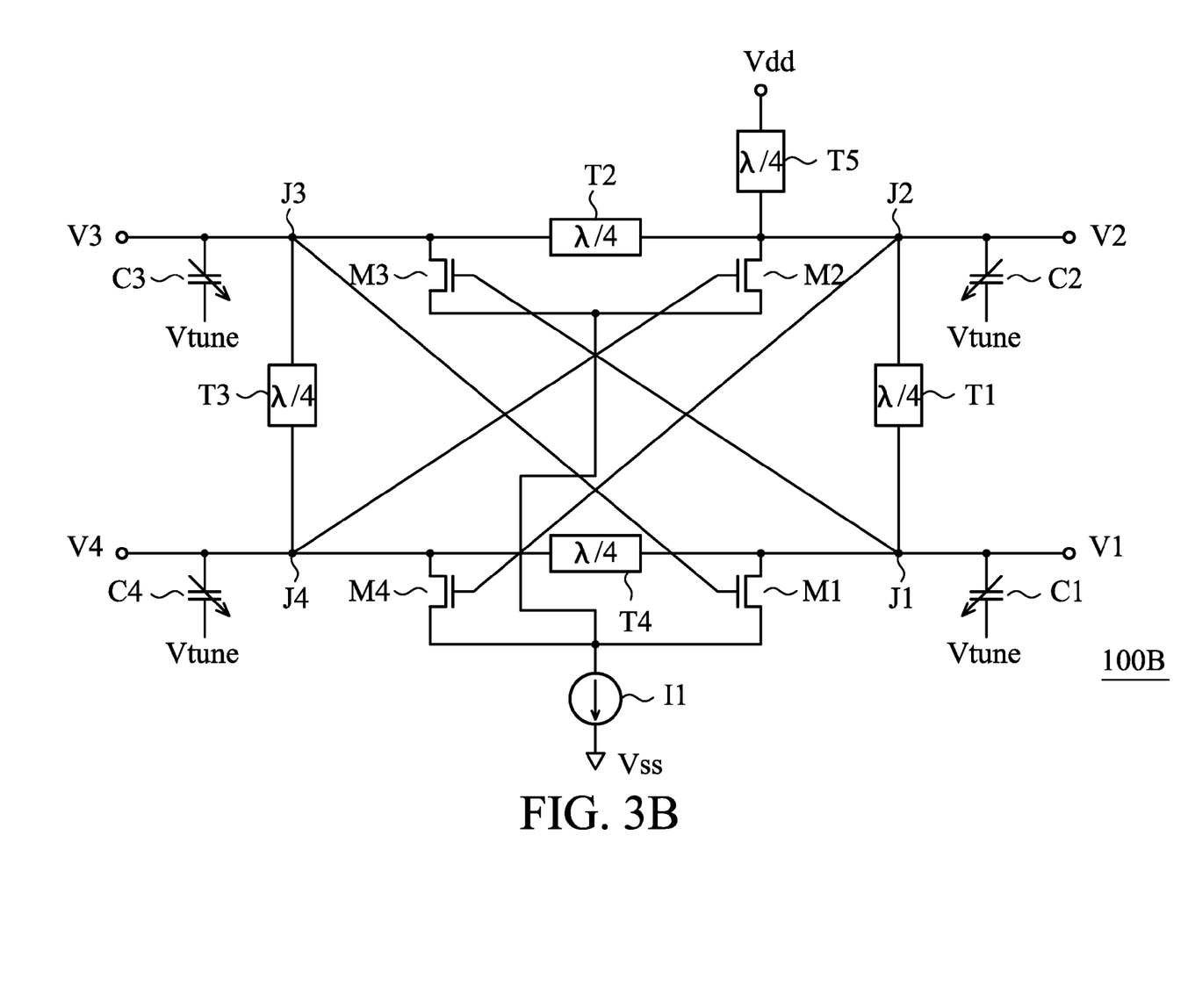

FIG. 3B shows an alternative embodiment of a 4-phase VCO circuit 100B. VCO circuit 100B is identical in all respects to VCO circuit 100A except that the circuit 100B includes a constant tail current source I1 coupled between the source terminals of transistor T1-T4 and the low power supply node. This embodiment allows for better control of the supply current.

Figure 4A:
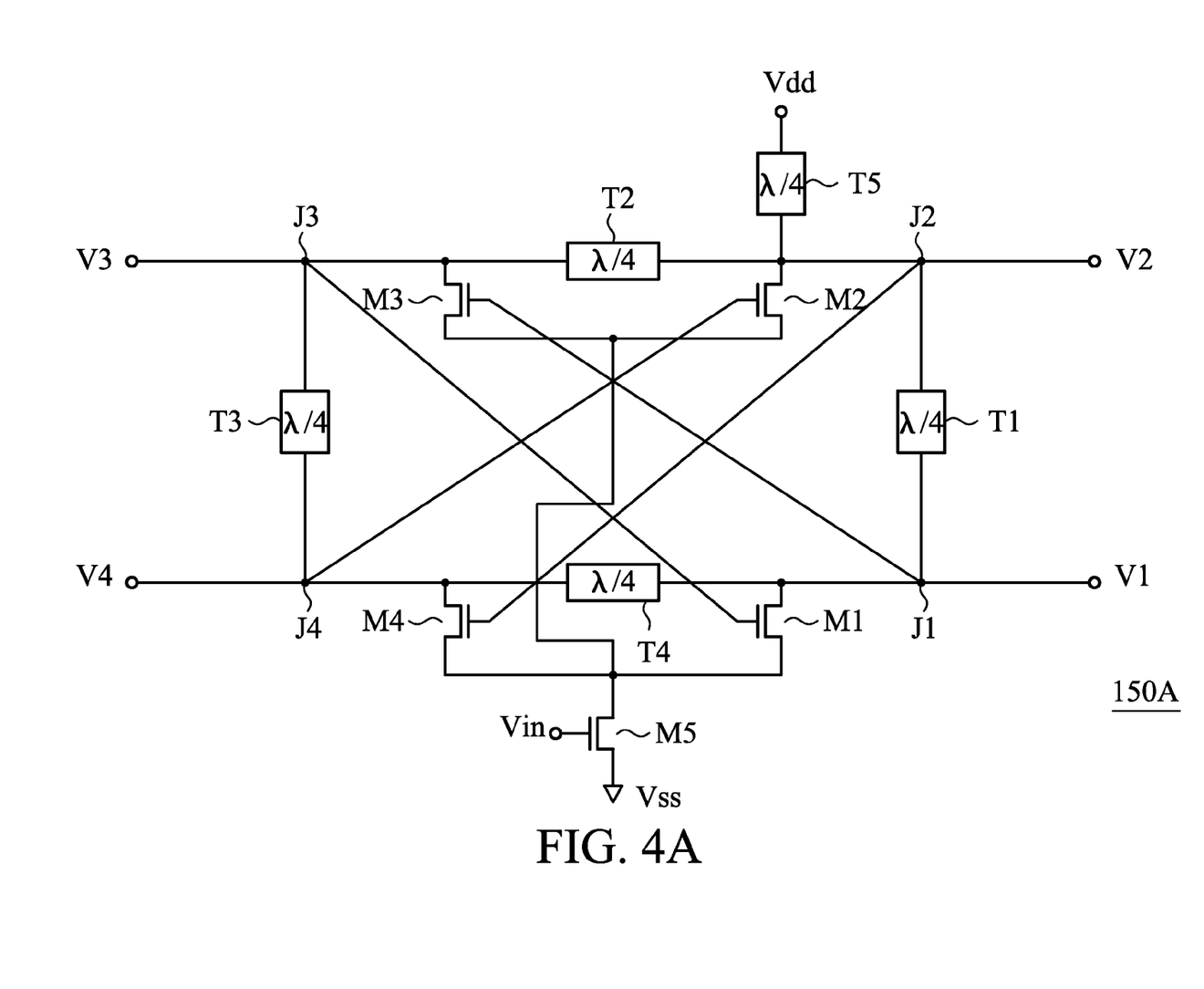
FIGS. 4A-4C are circuit diagrams of embodiments of a divide-by-four injection-locked frequency divider in accordance with the present invention.
Figure 4B:
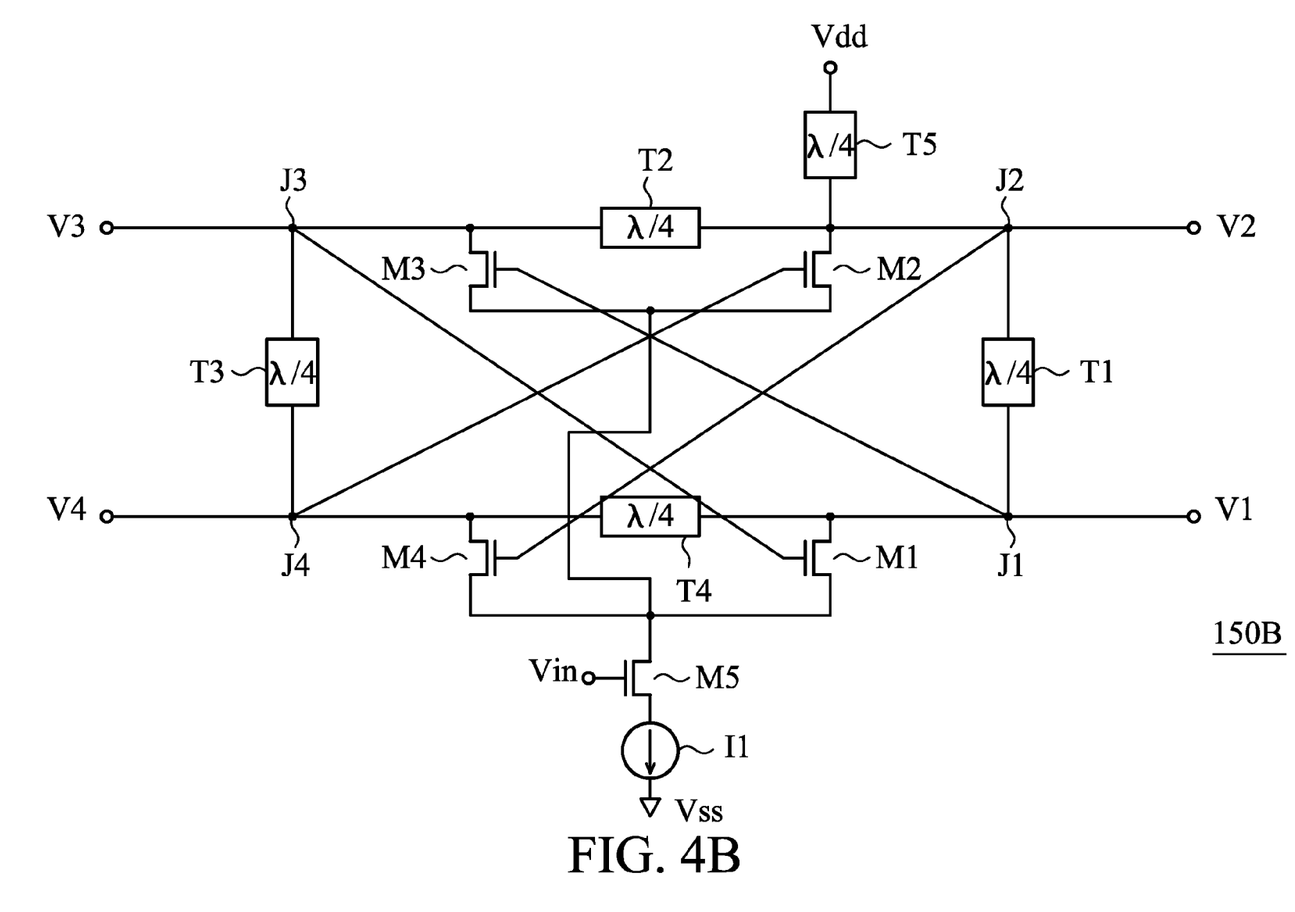
Figure 4C:
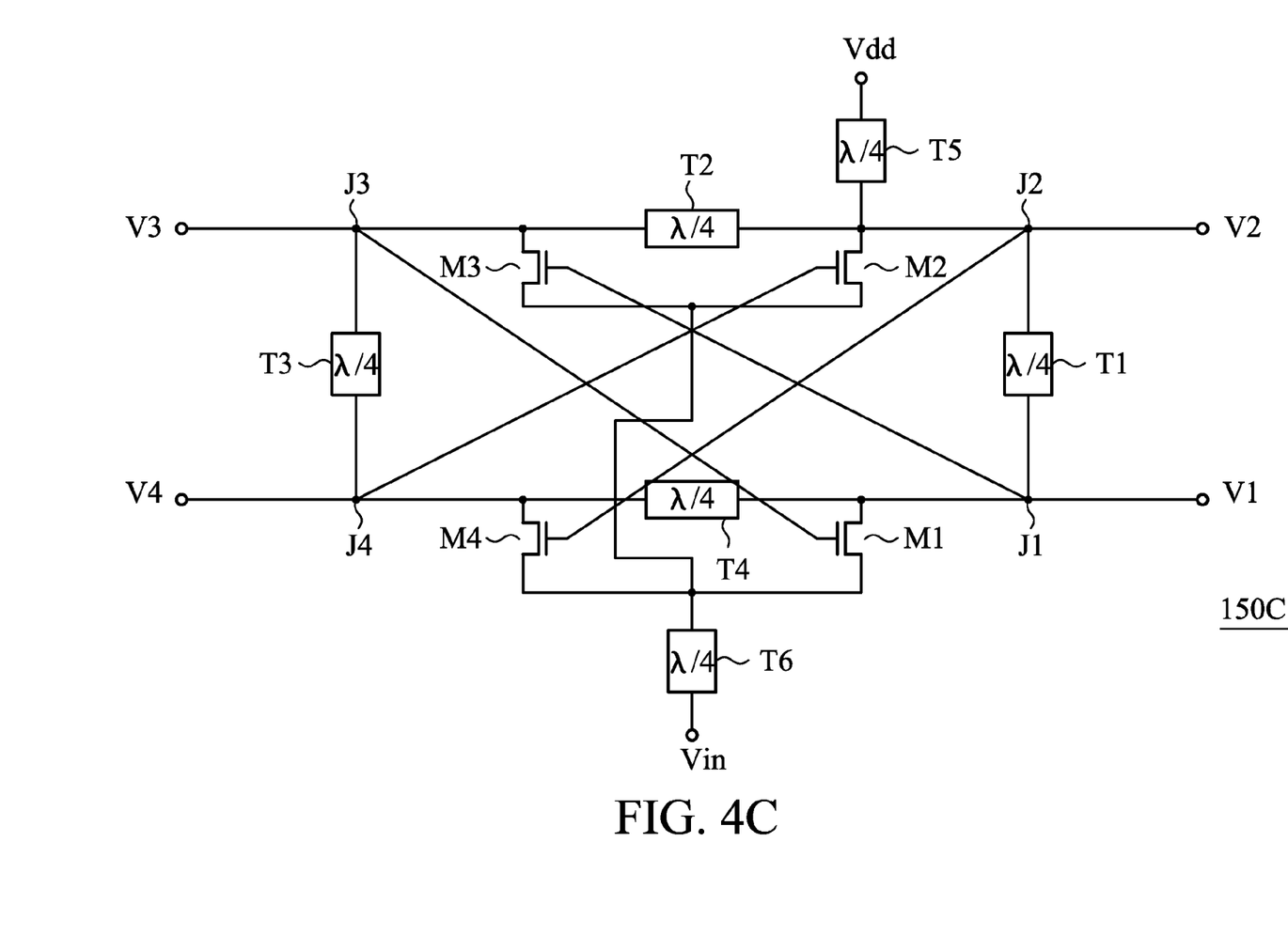

FIGS. 4A to 4C illustrate that the basic circuit topology used to form a four-phase VCO as described above can be easily adapted to form a divide-by-four injection-locked frequency divider. Specifically, FIGS. 4A-4C illustrate circuit diagrams of a divide-by-four frequency divider adapted from the circuit topology used to form the VCO 100A or 100B. With specific reference to FIG. 4A, this figure shows a divide-by-four injection-locked frequency divider circuit 150A. The circuit 150A includes four $\lambda/4$ delay lines T1 to T4 arranged in a ring, with adjacent delay lines meeting at junctions J1 to J4. Transistors M1 to M4 are coupled to junctions J1 to J4, respectively. The drain terminal of each transistor is coupled to a respective junction and the source terminals of each transistor M1 to M4 are coupled together to the low power supply node (Vss). A switch, shown as transistor M5 is coupled between the source terminals of transistors M1 to M4 and is controlled at its gate terminal by an input signal Vin. The input signal Vin has a frequency f. The frequency of the input signal Vin is divided by the number of delay segments T1-T4 (which equals the number of junctions J1 to J4) in the transmission line ring. The output signals V1 to V4 at junctions J1 to J4 have a frequency equal to f/4 and also have phases of 0, 90, 180, and 270 degrees.

FIG. 4B is a circuit diagram of a second embodiment of a divide-by-four injection-locked frequency divider. The circuit 150B of FIG. 4B is identical in all respects to the circuit 150A of FIG. 4A only a constant tail current source I1 is coupled to the source terminals of the transistors M1 to M4 through transistor M5.

FIG. 4C is a circuit diagram of a third embodiment of a divide-by-four injection locked frequency divider. The circuit 150C is identical to the circuits 150A and 150B except that the source terminals of the transistors M1 to M4 are biased by the input voltage Vin through a sixth transmission delay line T6, which provides a delay of $\lambda/4$.

Figure 5:
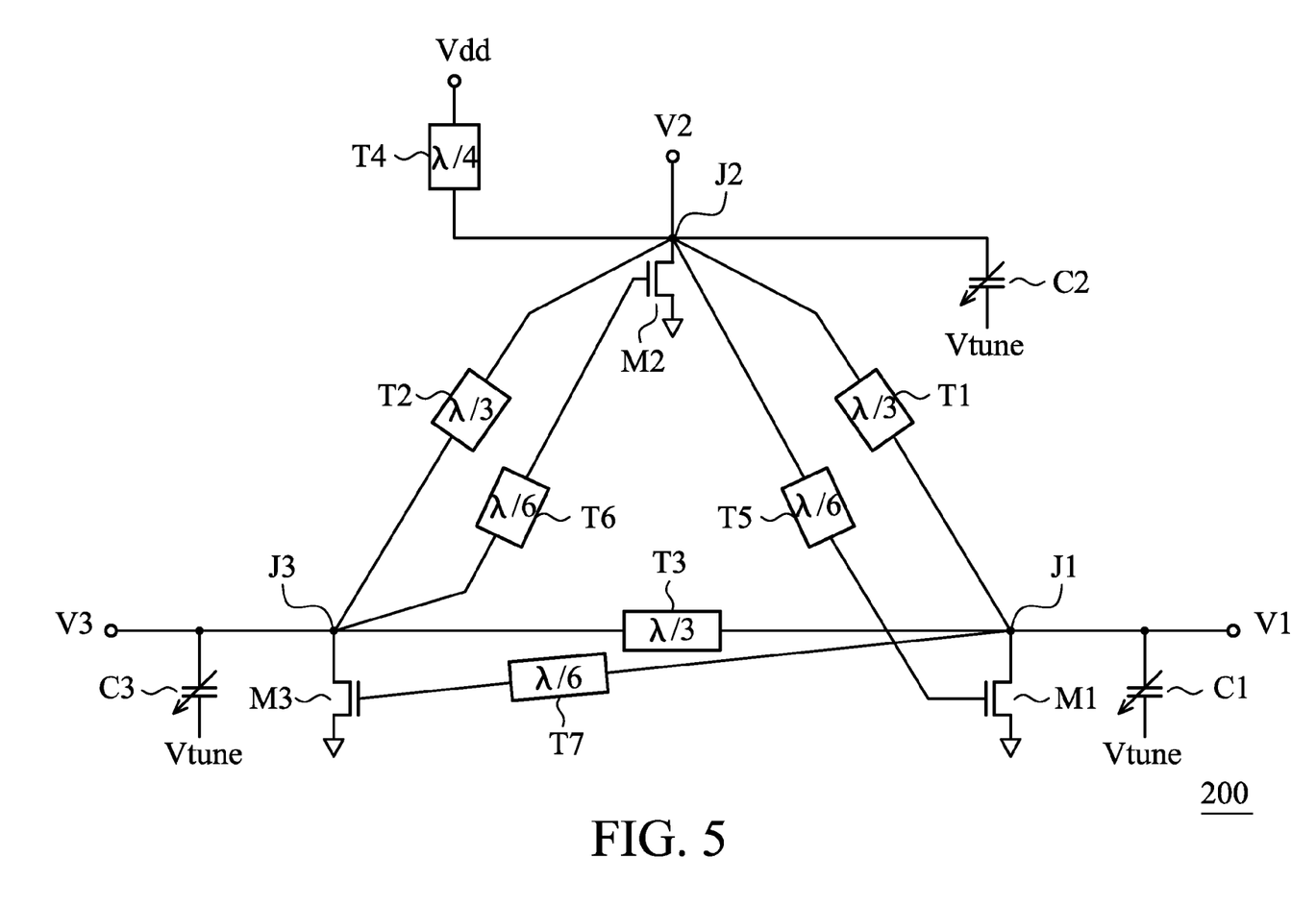
FIG. 5 is a circuit diagram of an embodiment of a 3-phase VCO circuit in accordance with the present invention.
Figure 6:
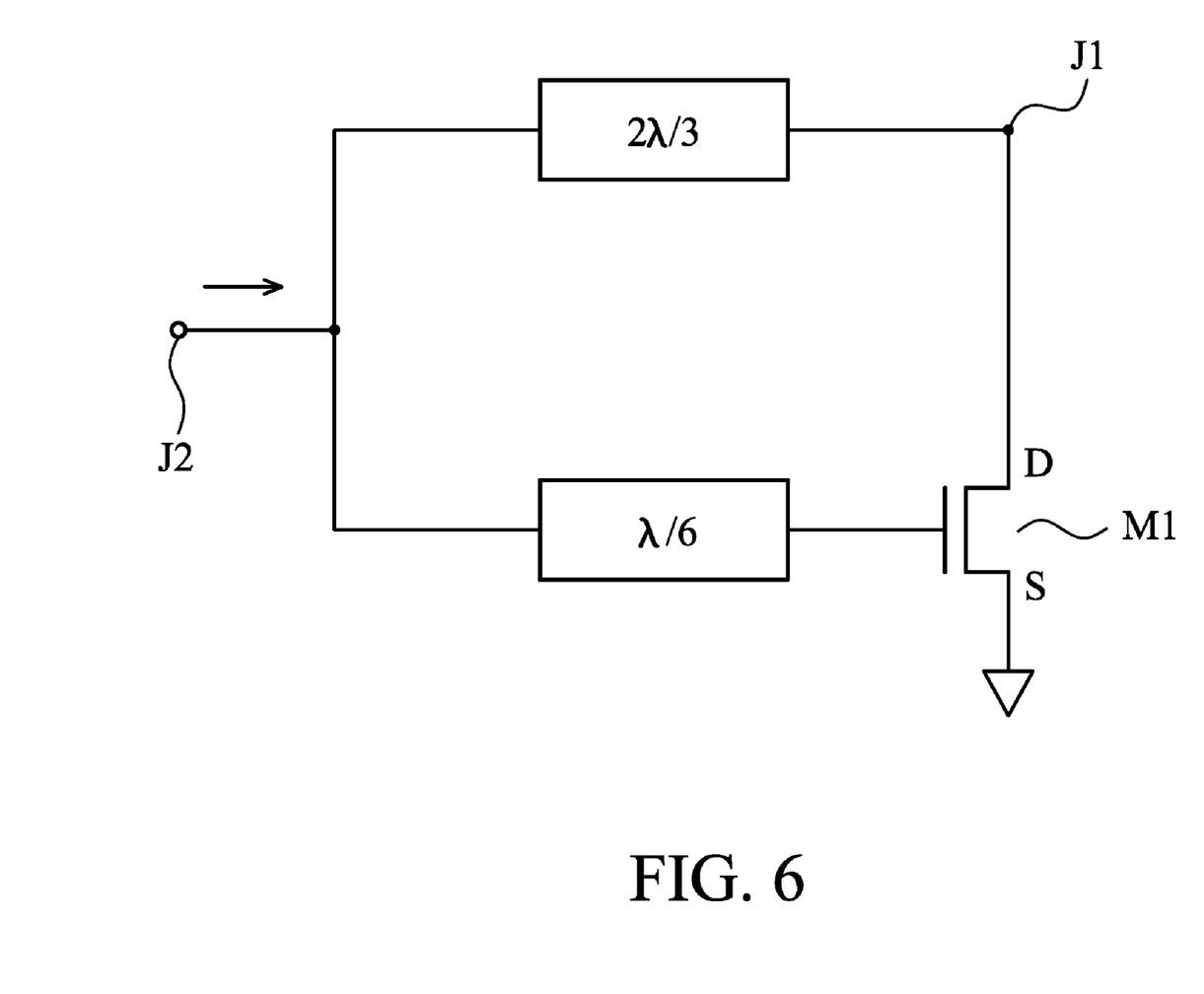
FIG. 6. illustrates the signal biasing at an individual junction of the transmission line ring shown in FIG. 5.

FIGS. 5 and 6 show that the circuit topology illustrated for the 4-phase VCO and for the divide-by-4 frequency divider can be easily adapted to odd phase devices. FIG. 5 shows a circuit diagram of a 3-phase VCO circuit 200. As with the 4-phase VCO circuit, the VCO circuit includes a transmission line ring having n number of $\lambda/n$ delay lines connected in a ring at n junctions. Here, n is 3, so the ring includes three $\lambda/3$ delay lines T1 to T3 with adjacent delay lines of the ring connected at junctions J1 to J3. The VCO circuit 200 also includes n number of transistors (i.e., M1 to M3) coupled to the junctions J1 to J3. The circuit 200 is DC biased from high power supply node Vdd through a fourth delay line T4 ($\lambda/4$) though it should be appreciated that each junction J1 to J3 could also be coupled directly to Vdd. Each junction J1 to J3 is also coupled to one of varactors C1 to C3. The varactors are controlled by tuning voltage Vtune for fine tuning the frequency of the VCO circuit 200.

Since the circuit topology calls for the gate terminal of each transistor to be biased by a signal that is 180° ($\lambda/2$) out of phase with the signal that biases its drain terminal, an additional delay line element is inserted between the gate terminal and the junction node used to bias the gate terminal. For example, delay line T5 is disposed between the gate of transistor M1 and junction J2; delay line T6 is disposed between the gate of transistor M2 and junction J3; and delay line T3 is disposed between the gate of transistor M3 and the junction J1. In order to provide the 180° ($\lambda/2$) phase difference between the gate and drain terminals of a given transistor M1 to M3, the delay of delay lines T5 to T7 is set to $\lambda/6$. As shown in FIG. 6, the phase difference between the signal that drives the gate terminal of a transistor coupled to a junction of the transmission line ring and its drain terminal is $\frac{2}{3}\lambda - \lambda/6$, which equals $\lambda/2$. Using M1 as an example in FIG. 6, the value $\frac{2}{3}\lambda$ represents the sum of the delays from transmission lines T2 and T3, and the value $\lambda/6$ represents the value of delay through transmission line T5.

It should be understood that the circuit topology of FIG. 5 illustrates only one embodiment of a 3-phase VCO circuit in accordance with the present teachings. That is, an alternative low or high power supply biasing techniques, such as that illustrated in FIG. 3B, may be adopted. Further, the topology could be adapted to provide a divide-by-three injection-locked frequency divider based on the teachings of FIGS. 4A to 4C.

Figure 7:
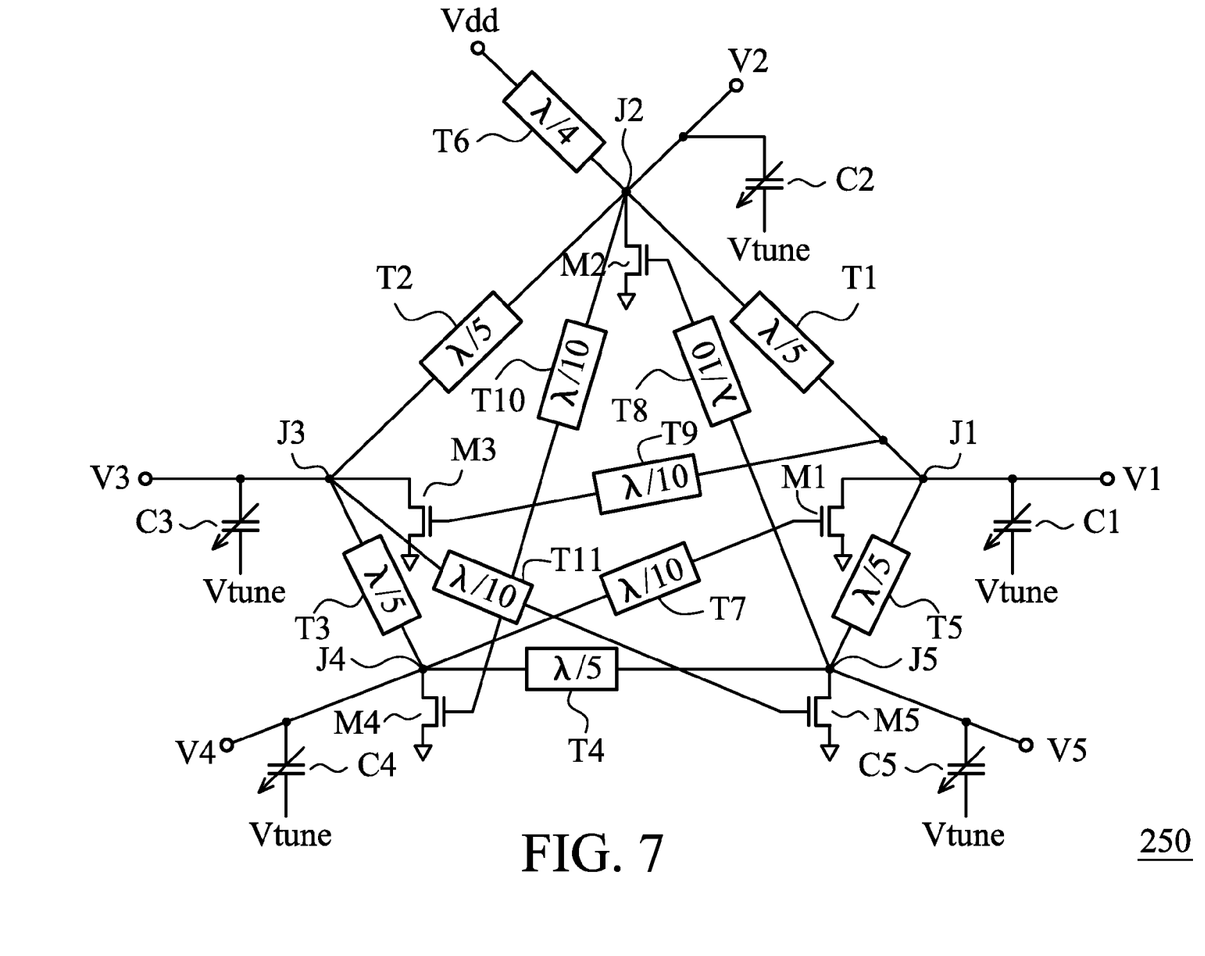
FIG. 7 is a circuit diagram of an embodiment of a 5-phase VCO circuit in accordance with the present invention.
Figure 8:
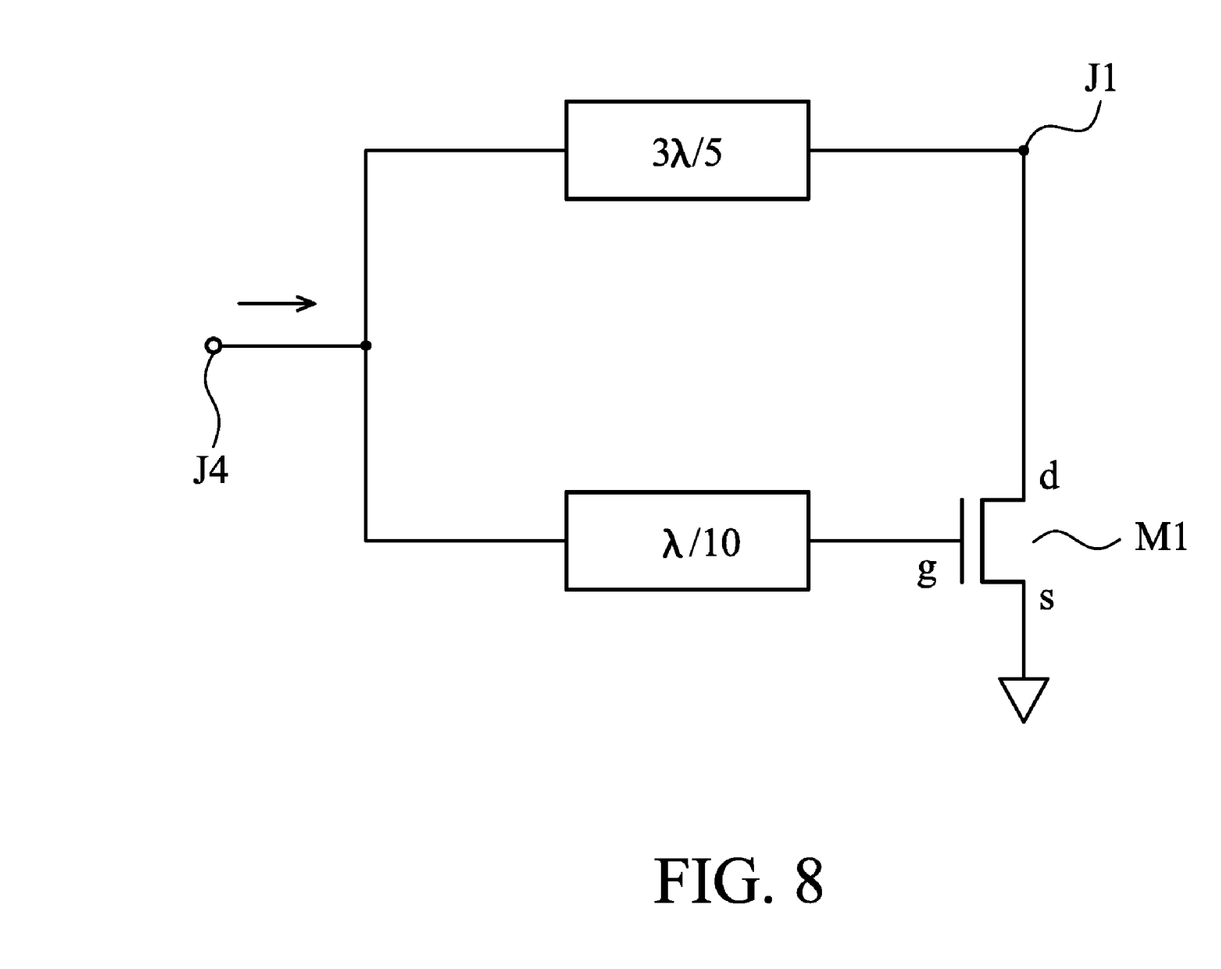
FIG. 8. illustrates the signal biasing at an individual junction of the transmission line ring shown in FIG. 7.

FIGS. 7 and 8 show that the circuit topology is easily adapted to a 5-phase VCO circuit 250. As with the 3 and 4-phase VCO circuits, the VCO circuit 250 includes a transmission line ring having n number of $\lambda/n$ delay lines connected in a ring at n junction. Here, n is 5, so the ring includes five $\lambda/5$ delay lines T1 to T5 with adjacent delay lines connected at junctions J1 to J5. The VCO circuit 250 also includes n number of transistors (i.e., M1 to M5) coupled to the junctions J1 to J5. The circuit 200 is DC biased from high power supply node Vdd through a sixth delay line T6 ($\lambda/4$). Each junction J1 to J5 is also coupled to one of varactors C1 top C5. The varactors are controlled by tuning voltage Vtune for fine tuning the frequency of the VCO circuit 250.

Since the circuit topology calls for the gate terminal of each transistor to be biased by a signal that is 180° ($\lambda/2$) out of phase with the signal that biases its drain terminal, an additional delay line element is inserted between the gate terminal and the junction node used to bias the gate terminal. For example, delay line T7 is disposed between the gate of transistor M1 and junction J4; delay line T8 is disposed between the gate of transistor M2 and junction J5; delay line T9 is disposed between the gate of transistor M3 and the junction J1; delay line T10 is disposed between the gate of transistor M4 and the junction J2; and delay line T11 is disposed between the gate of transistor M5 and the junction J3. In order to provide the 180° ($\lambda/2$) phase difference between the gate and drain terminals of a given transistor M1 to M5, the delay of delay lines T7 to T11 is set to $\lambda/10$. As shown in FIG. 8, the phase difference between the signal that drives the gate terminal of a transistor coupled to a junction of the transmission line ring and its drain terminal is $\frac{3}{5}\lambda - \lambda/10$, which equals $\lambda/2$. Using M1 as an example in FIG. 8, the value $\frac{3}{5}\lambda$ represents the sum of transmission lines T1, T2 and T3, and the value $\lambda/10$ represents the value of transmission line T7.

Figure 10:
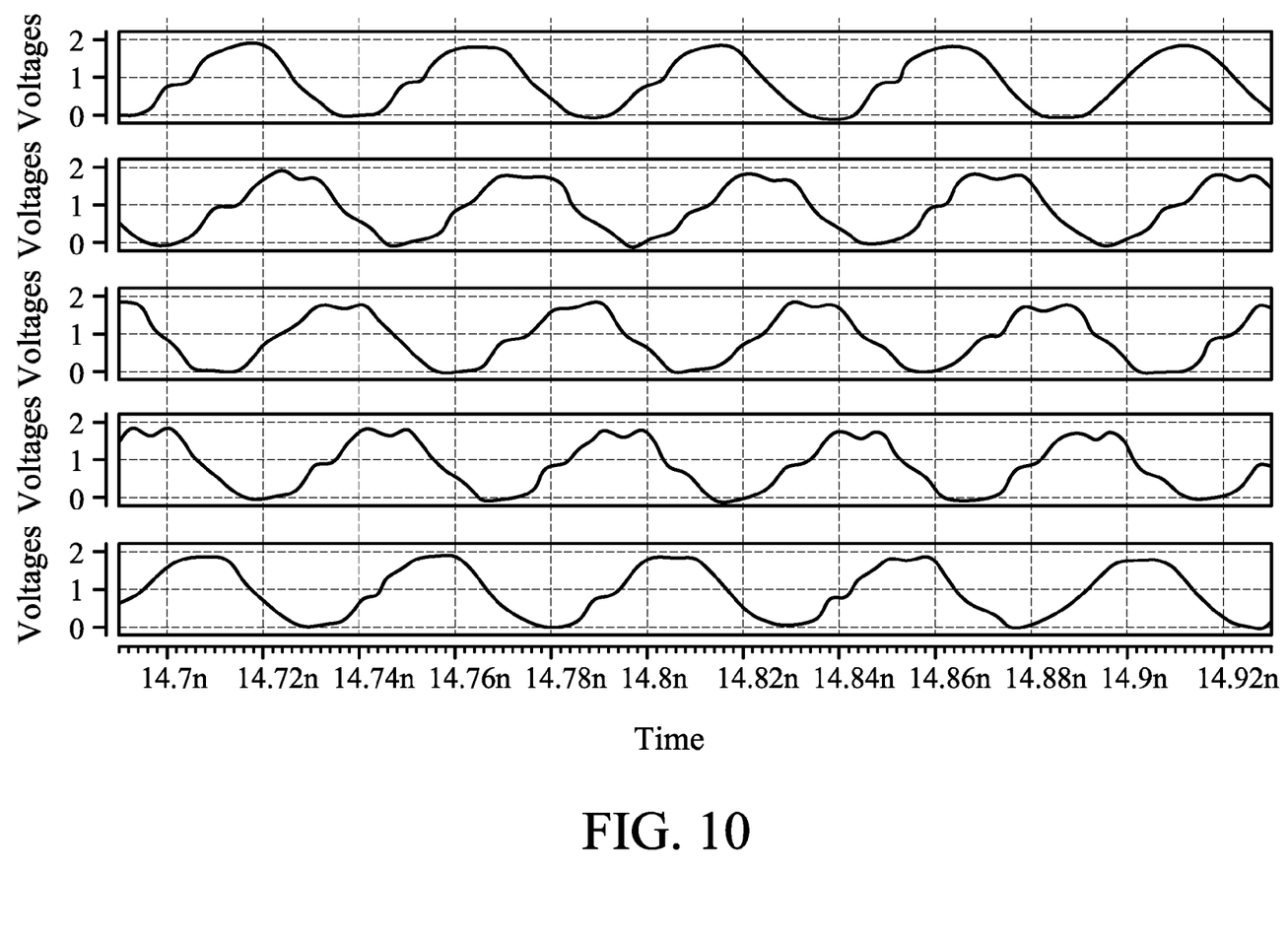
FIG. 10 shows the simulation results for a 5-phase VCO circuit.

SPICE simulation results for the five-phased VCO circuit 250 are shown in FIG. 10. As can be seen from the results, the outputs V1 to V5 at junctions J1 to J5 oscillate at the same selected frequency f. The signal are each 72° apart (360°/5) from one another. It was actually observed that the circuit 250 could be operated in two modes. The first mode, shown in FIG. 10, provides a 5-phase signal that oscillates at frequency f. Essentially, the circuit behaves as if every node is coupled and operated in separate phases. In a second mode, each node oscillates with identical phase but 5 times higher frequency. This mode can be suppressed when the oscillation frequency reaches beyond the cutoff frequency of the transistors and/or the transmission delay lines in the circuit 250. In the simulation, this mode occurred at a frequency of about five times f. As such, to provide a multi-phase VCO output, the frequency f should be kept below the cutoff frequency, while F*n should be kept above the cutoff frequency of the devices in the VCO circuit to suppress the undesired mode.

It should be understood that the circuit topology of FIG. 7 illustrates only one embodiment of a 5-phase VCO circuit in accordance with the present teachings. That is, an alternative low or high power supply biasing techniques, such as that illustrated in FIG. 3B, may be adopted. Further, the topology could be adapted to provide a divide-by-five injection-locked frequency divider based on the teachings of FIGS. 4A to 4C.

It should be appreciated that another way of obtaining an odd n-phase VCO circuit is to construct an even 2n-phase VCO circuit in accordance with the circuit topology disclosed herein. In this case, the output of every other node is selected to provide the desired n-phase signal.

While the circuits shown herein have been illustrated using NMOS transistors, it should be understood that PMOS transistors may be used. In that case, the PMOS transistors would be substituted in the circuit diagrams for the NMOS transistors, with their source terminals connected to the nodes to which the NMOS drain terminals are connected.

The circuit topology described herein is easily extrapolated to provide a VCO with any number, odd or even, of desired phases as well as to frequency dividers. There is no need for ad hoc design solutions, and unlike some prior art designs, there is no need to over-design for odd numbers of phases. That is, there is no need to design an even numbered 14-phase VCO to obtain an odd numbered 7 desired phases. Further, the circuit topology minimizes the number of transistors required at each node as well as the number of transmission line segments. For example, a single transistor can be used at each node rather than a local pair of transistors each coupled to its own respective transmission line, as is used in some prior art designs. The circuit topology thus provides a real benefit in terms of size.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A circuit topology for use in an n-phase voltage controlled oscillator (VCO) or injection-locked frequency divider, comprising:

a transmission line ring comprising n transmission line delay segments connected at n junctions, where n is an odd integer greater than or equal to 3, each transmission line segment providing a 1/n wavelength signal delay between adjacent junctions, the transmission line ring being coupled to a first power supply node; and each of the junctions having a respective transistor coupled thereto, each transistor having a first source/drain terminal coupled to its respective junction; a second source/drain terminal coupled to a second power supply node, and a gate terminal, wherein the gate terminal is coupled to a signal that is ½ wavelength out-of-phase with respect to a signal at the first source/drain terminal of the transistor.

2. The circuit topology of claim 1, further comprising a plurality of second transmission line delay segments, the second transmission line delay segments providing a delay less than 1/n wavelength, wherein each of the second transmission line delay segments is disposed between the gate terminal of a respective transistor and the junction from the transmission line ring to which the gate terminal is coupled, wherein the delay line segments from the transmission line ring and the second delay line segments cooperate to provide a ½ wavelength delay between the gate and first source/drain terminal of each transistor.

3. The circuit topology of claim 1, wherein the second source/drain terminals of the transistors are coupled to the second power supply node through a constant current source.

4. The circuit topology of claim 1, further comprising a second transmission line delay segment disposed between one of the junctions of the transmission line ring and the first power supply node, whereby the transmission line ring is coupled to the first power supply node.

5. The circuit topology of claim 4, wherein the second transmission line delay segment provides a ¼ wavelength signal delay.

6. The circuit topology of claim 1, wherein the circuit topology forms a part of an n-phased VCO.

7. The circuit topology of claim 6, wherein each junction has a varactor coupled thereto, the varactor configured to receive a tuning voltage, wherein different phases of an oscillating signal are provided at each junction.

8. A circuit topology for use in an n-phase voltage controlled oscillator (VCO) or injection-locked frequency divider, comprising:
  a transmission line ring comprising n transmission line delay segments connected at n junctions, where n an integer greater than or equal to 3, each transmission line segment providing a 1/n wavelength signal delay between adjacent junctions, the transmission line ring being coupled to a first power supply node; and
  each of the junctions having a respective transistor coupled thereto, each transistor having a first source/drain terminal coupled to its respective junction, a second source/drain terminal coupled to a second power supply node, and a gate terminal, wherein the gate terminal is coupled to a signal that is ½ wavelength out-of-phase with respect to a signal at the first source/drain terminal of the transistor, wherein the circuit topology forms a part of an injection locked frequency divider.

9. The circuit topology of claim 8, wherein the injection locked frequency divider is configured to divide a frequency of an input signal by n.

10. The circuit topology of claim 9, further comprising a switch coupled between the second source/drain terminals of the transistor and the second power supply node, wherein the switch is controlled by the input signal.

11. The circuit topology of claim 10, wherein the switch, is a transistor having a gate terminal for receiving the input signal.

12. The circuit topology of claim 11, further comprising a constant current source disposed between the second source/drain terminals and the second power supply node.

13. The circuit topology of claim 9, wherein the second power supply node is biased with the input signal, the circuit topology further comprising a second transmission line delay segment disposed between the second power supply node and the second source/drain terminals, wherein the second transmission line delay segment provides a ¼ wavelength, delay.

14. An n-phase voltage controlled oscillator (VCO), where n is an integer greater than or equal to 3, comprising:
  a transmission line ring including n transmission line delay segments connected at n junctions, each transmission line segment providing a 1/n wavelength signal; delay between adjacent junctions, the transmission line ring being coupled to a first power supply node;
  each of the junctions having a respective transistor coupled thereto, each transistor having a first source/drain terminal coupled to its respective junction, a second source/drain terminal coupled to a second power supply node, and a gate terminal, wherein the gate terminal is coupled to a signal that is ½ wavelength out-of-phase with respect to a signal at the first source/drain terminal of the transistor; and
  each of the junctions having a respective varactor coupled thereto for receiving a tuning voltage, wherein different phases of an oscillating signal are provided at each junction,
  wherein n is an odd integer.

15. A divide-by-n injection-locked frequency divider, where n is an integer greater than or equal to 3, comprising:
  a transmission line ring including n transmission line delay segments connected at n junctions, each transmission line segment providing a 1/n wavelength signal delay between adjacent junctions, the transmission line ring being coupled to a first power supply node; and
  each of the junctions having a respective transistor coupled thereto, each transistor having a first source/drain terminal coupled to its respective junction, a second source/drain terminal coupled to an oscillating input signal having a frequency f, and a gate terminal, wherein the gate terminal is coupled to a signal that is ½ wavelength out-of-phase with respect to a bias signal at the first source/drain terminal of the transistor;
  wherein an output signal having a frequency f/n is provided at the junctions.

16. The frequency divider of claim 15, further comprising a switch coupled between the second source/drain terminals of the transistor and a second power supply node, wherein the switch is controlled by the oscillating input signal.

17. The frequency divider of claim 15, further comprising a second transmission line delay segment coupled to the second source/drain terminals, the second transmission line delay segment provides a 1/n wavelength signal delay, wherein the oscillating input signal is coupled to the transistors through the second transmission delay line segment.

18. A circuit topology for use in an n-phase voltage controlled oscillator, (VCO) or injection-locked frequency divider, comprising:
  a transmission line ring comprising n transmission line delay segments connected at n junctions, where n is an integer greater than or equal to 3, each transmission line segment providing a 1/n wavelength signal delay between adjacent, junctions, the transmission line ring being coupled to a first power supply node;
  each of the junctions having a respective transistor' coupled thereto, each transistors having a first source/drain terminal coupled to its respective, junction, a second source/drain terminal coupled to a second power supply node, and a gate terminal, wherein the gate terminal is coupled to a signal that is ½ wavelength out-of-phase with respect to a signal at the first source/drain terminal of the transistor; and
  a plurality of second transmission line delay segments, the second transmission line delay segments providing a delay less than 1/n wavelength, wherein each of the second transmission line delay segments is disposed between the gate terminal of a respective transistor and the junction from the transmission line ring to which the gate terminal is coupled, wherein the delay line segments from the transmission line ring and the second delay line segments cooperate to provide a ½ wavelength delay between the gate and first source/drain terminal of each transistor.

19. A Circuit topology for use in an n-phase voltage controlled oscillator (VCO) or injection-locked frequency divider, comprising:

a transmission line ring comprising n transmission line delay segments connected at n junctions; where n is an integer greater than or equal to 3, each transmission line segment providing a 1/n wavelength signal delay between adjacent junctions, the transmission line ring being coupled to a first power, supply node;

each of the junctions having a respective transistor coupled thereto, each transistor having a first source/drain terminal coupled to its respective junction, a second source/drain terminal coupled to a second power supply node, and a gate terminal, wherein the gate terminal is coupled to a signal that is ½ wavelength out-of-phase with respect to, a signal at the first source/drain terminal of the transistor; and a second transmission line delay segment disposed between one of the junctions of the transmission line ring and the first power supply node, whereby the transmission line, ring is coupled to the first power supply node, wherein the second transmission line, delay segment provides a ¼ wavelength signal delay.

\* \* \* \* \*

UNITED STATES PATENT AND TRADEMARK OFFICE
CERTIFICATE OF CORRECTION

PATENT NO. : 8,115,560 B2  
APPLICATION NO. : 12/686686  
DATED : February 14, 2012  
INVENTOR(S) : Shine Chung It is certified that error appears in the above-identified patent and that said Letters Patent is hereby corrected as shown below:

Column 7, Line 55, Claim 13, delete the "," after the word "wavelength" and insert the word -- signal -- therefor.

Column 8, Line 44, Claim 18, delete the "," after the word "adjacent".

Column 8, Line 46, Claim 18, delete the """ after the word "transistor".

Column 8, Line 47, Claim 18, delete "each transistors" and insert -- each transistor -- therefor.

Column 8, Line 65, Claim 19, delete "Circuit" and insert -- circuit -- therefor.

Signed and Sealed this
Sixteenth Day of October, 2012

David J. Kappos
*Director of the United States Patent and Trademark Office*